(12) United States Patent
Takanashi et al.

(10) Patent No.: US 9,816,199 B2
(45) Date of Patent: Nov. 14, 2017

(54) METHOD OF MANUFACTURING SINGLE CRYSTAL

(71) Applicant: SUMCO CORPORATION, Tokyo (JP)

(72) Inventors: Keiichi Takanashi, Tokyo (JP); Ken Hamada, Tokyo (JP)

(73) Assignee: SUMCO CORPORATION, Tokyo (JP)

( * ) Notice: Subject to any disclaimer, the term of this patent is extended or adjusted under 35 U.S.C. 154(b) by 83 days.

(21) Appl. No.: 14/965,177

(22) Filed: Dec. 10, 2015

(65) Prior Publication Data

US 2016/0186359 A1 Jun. 30, 2016

(30) Foreign Application Priority Data

Dec. 24, 2014 (JP) .................................. 2014-259920

(51) Int. Cl.
*C30B 15/02* (2006.01)
*C30B 15/26* (2006.01)
*C30B 29/06* (2006.01)
*G06T 7/00* (2017.01)
*G06T 7/62* (2017.01)
*G06T 7/66* (2017.01)

(52) U.S. Cl.
CPC .............. *C30B 15/26* (2013.01); *C30B 15/02* (2013.01); *C30B 29/06* (2013.01); *G06T 7/0004* (2013.01); *G06T 7/62* (2017.01); *G06T 7/66* (2017.01); *G06T 2207/20192* (2013.01); *G06T 2207/30116* (2013.01); *G06T 2207/30148* (2013.01)

(58) Field of Classification Search
CPC ............................... C30B 15/02; C30B 15/20
See application file for complete search history.

(56) References Cited

U.S. PATENT DOCUMENTS 7,172,656 B2 * 2/2007 Takanashi ............... C30B 15/26
117/14
9,284,660 B2 3/2016 Takanashi et al.
2004/0221794 A1 11/2004 Takanashi et al.
(Continued)

FOREIGN PATENT DOCUMENTS

JP 2003-012395 A 1/2003
JP 2007-290906 A 11/2007
(Continued)

*Primary Examiner* — Robert M Kunemund
(74) *Attorney, Agent, or Firm* — Greenblum & Bernstein, P.L.C.

(57) ABSTRACT

A manufacturing method of single crystal is provided with a melting process for dissolving raw material in a crucible and a pulling-up process of a single crystal from a melt by the Czochralski method. The pulling-up process includes detecting an edge line of a fusion ring, determining an approximated curve of the edge line by approximating the edge line of the fusion ring by an even function, eliminating constituent pixels of the fusion ring from the image of the fusion ring as noise, the constituent pixels being positioned on the side of the melt relative to the approximated curve and the constituent pixels of the fusion ring and a deviation between the constituent pixels and the approximated curve being a predetermined number of pixels, and calculating the center position of the single crystal from the edge line of the fusion ring from which the noise has been eliminated.

9 Claims, 6 Drawing Sheets

(56) References Cited

U.S. PATENT DOCUMENTS

2009/0064923 A1 3/2009 Takanashi
2009/0232359 A1 9/2009 Urano et al.
2013/0263773 A1 10/2013 Takanashi et al.

FOREIGN PATENT DOCUMENTS

| JP | 4089500 B2 | 5/2008 |
| JP | 2009-057216 A | 3/2009 |
| JP | 4246561 B2 | 4/2009 |
| JP | 2013-159525 A | 8/2013 |

* cited by examiner

METHOD OF MANUFACTURING SINGLE CRYSTAL

BACKGROUND OF THE INVENTION

Field of the Invention

The present invention relates to a method of manufacturing a single crystal by the Czochralski method (hereinafter referred to as CZ method) and, more particularly, to a method of measuring a melt surface position and a diameter of a single crystal in a pulling-up process of the single crystal.

Description of Related Art

The CZ method is one method for growing a silicon single crystal which becomes semiconductor materials. With the CZ method, a cylindrical single crystal is grown by slowly pulling up a seed crystal hanging on a wire, while coming in contact with melt in a crucible and solidifying the melt.

The melt inside the crucible is gradually reduced as the pulling-up process progresses. As such, in order to keep the thermal dose to the melt by the heater constant, it is necessary to raise the crucible so that the melt surface position is at a predetermined position relative to the heater and the heat-shield structure. This is because if the melt surface position relative to the heater and the like is not predetermined, the temperature history of the single crystal changes, crystal defects emerge and a single crystal of good quality cannot be produced.

For this reason, a method is proposed, where the melt surface position is optically measured while the single crystal is being pulled up and an amount of rise for the crucible is calculated (Japanese Patent Nos. 408950 and 4246561 and Japanese Patent Application Laid Open Nos. 2007-290906 and 2009-57216). Because this method ascertains the melt surface position directly, the margin of error is low, allowing the quality of the single crystal to improve.

For example, Japanese Patent No. 408950 proposes a method for calculating a center position of a single crystal and from the position of the fusion ring that emerges near the solid-liquid interface between the single crystal and the melt and measuring the surface position from this center position. In this method, first and second measuring lines are defined in an image of a fusion ring, which is detected by employing image detection. The first and second measuring lines are provided in front of the dipping position of the seed crystal in the necking process in a perpendicular direction and are separated by the first and second distances each from the dipping position. Then, the center position of the single crystal along the perpendicular direction in the image is calculated from the two intervals between the intersections of each measuring line and the fusion ring, on both sides, and from the first and second distances, and the melt surface position is measured based on this center position. This method is advantageous as a measuring method of melt surface position as it is unaffected by any inclination of the liquid surface. Particularly, in situations where the fusion ring can only be partially observed during the pulling-up process of the single crystal, the center position of the single crystal can be calculated with little computation and as a result, the melt surface position can be measured with high precision in comparison to conventional methods.

Additionally, in order to increase the manufacturing yield of silicon wafers, it is also crucial to limit variation in the diameter of single crystals. As a method of maintaining a constant diameter of the single crystals, there is a known method that involves detecting the diameter of the single crystal while it is being pulled up and based on the detected diameter, controlling the pulling-up speed and the heater's power supply (heater temperature). Additionally, in Japanese Patent Application Laid Open No. 2003-12395, for example, a method is described, where the diameter of a single crystal is maintained by detecting the diameter and center of the boundary between the silicon melt and the single crystal, from an image of the boundary taken by an image-capturing device, thereby determining the diameter and center position of the single crystal and adjusting the growth conditions based on these results.

According to the inventor's experiments, in the conventional method described above, it is necessary to calculate the center position of the single crystal from the position of the fusion ring in the captured image, but a problem was found, where if the melt adheres to the heat shielding body, which is placed above the melt, and the luminance distribution of the fusion ring changes, it is not possible to accurately calculate the center position of the single crystal, and it is also not possible to accurately determine the surface position and the diameter of the single crystal.

The adherence of melt to the heat shielding body tends to occur when depositing additional raw material. Even if solid raw material is charged in the crucible to its full capacity beforehand and then melted, an empty volume emerges due to a reduction in volume of the raw material. It is then possible to increase the raw-material melt amount in the crucible by further depositing additional solid raw material. By so doing, it is possible to effectively utilize the capacity of the crucible and increase productivity in single-crystals growth.

However, if agglomerated raw material is additionally deposited to the melt, the impact causes some of the melt to spray on and adhere to the surface of the heat shielding body. In instances of melt adherence originating from additional deposits of raw material, because the deposit direction of the raw material is predetermined, much of the melt tends to adhere to a particular area on the heat shielding body, close to the additional-deposit position. Furthermore, the agglomerated raw material first packed into the crucible can lose its balance and collapse during the initial melting and splatter, causing the melt to adhere to the heat shielding body. There is no regularity to this type of melt adherence and the melt does not adhere to any particular location on the heat shielding body. These causes comprise only one example and there is a variety of causes for the adherence of melt on the heat shielding body. When the melt adheres to the surface of the heat-shielding body, it affects a change in the luminance distribution of the fusion ring, which increases a measurement error of the surface position and the diameter of the single crystal.

It is possible to resolve measurement deviation due to melt adherence by replacing the heat shielding body. However, since melt adherence usually occurs during the raw-material melting process, it is not possible to make the replacement while the melting process is taking place. In addition and the manufacturing cost will increase if the frequency of replacement is high. It is therefore desirable to resolve measurement deviation due to melt adherence without replacing the heat shielding body.

SUMMARY OF THE INVENTION

It is therefore an object of the present invention to provide a method of manufacturing a single crystal capable of accurately calculating the center position of the single crystal from the fusion ring even if the melt adheres to the heat shielding body, thereby measuring and controlling the surface level of the melt and the diameter of the single crystal with high precision.

In order to resolve the above problem, a method of manufacturing a single crystal comprises a melting process which generates a melt by dissolving raw material in a crucible, and a pulling-up process which pulls up a single crystal from the melt by the Czochralski method. The pulling-up process includes a step of calculating a center position of the single crystal from an image of a fusion ring which appears near a solid-liquid interface between the single crystal and the melt. The step of calculating the center position of the single crystal includes steps of detecting an edge line of the fusion ring, determining an approximated curve of the edge line by approximating the edge line of the fusion ring by an even function, eliminating constituent pixels of the fusion ring from the image of the fusion ring as noise, the constituent pixels being positioned on the side of the melt relative to the approximated curve and the constituent pixels of the fusion ring and a deviation between the constituent pixels and the approximated curve being at least a predetermined number of pixels, and calculating the center position of the single crystal from the edge line of the fusion ring from which the noise has been eliminated.

With the present invention, even if luminance distribution of the fusion ring changes due to adherence of melt onto the bottom end of the heat shielding body, it is possible to accurately detect the true fusion ring by eliminating the effects from melt adherence onto the heat shielding body. Consequently, the center position of the single crystal can be accurately ascertained from the fusion ring and ultimately the quality of single crystals can be improved.

In the present invention, it is preferable that the pulling-up process further includes a step of determining the distance from a surface of the melt to a lower end of the heat shielding body that is disposed above the melt based on the center position of the single crystal. By so doing, the position of the melt surface against the heat shielding body can be accurately determined and the melt-surface position can be controlled with high precision. Consequently, the quality of the single crystal can be improved.

In the present invention, it is preferable that the pulling-up process further includes a step of determining a diameter of the single crystal based on the center position of the single crystal and the edge line of the fusion ring from which the effect of the noise has been eliminated. By so doing, the diameter of the single crystal can be accurately determined and the diameter of the single crystal can be controlled with high precision. Consequently, the manufacturing yield of single crystal wafers can be improved.

In the manufacturing method of single crystals according to the present invention, it is preferable that the step of eliminating the noise from the fusion ring is repeated again at a predetermined number of times. That is to say, in the present invention, it is preferable to further include a step, wherein the edge line of fusion ring, from which the noise has been removed, is approximated as an even function and an approximated curve of the edge line is determined, the edge line is positioned on the side of the melt relative to the approximated curve and the fusion ring's constituent pixels, the deviation from the approximated curve of which is at least a predetermined number of pixels, are eliminated from the image of the fusion ring as noise. With this method, the edge line of the fusion ring, from which the effect of melt adherence has been sufficiently removed, can be ascertained. As a result, the center position of the single crystal can be more accurately determined from the edge line of the fusion ring and the quality of the single crystal can be further improved.

In the present invention, it is preferable that the predetermined number of pixels is 1 pixel. If the constituent pixel of the fusion ring, the deviation from the approximate curve of which is at least 1 pixel, is eliminated as noise, the effect of melt adherence can be removed with 1 application of the noise-elimination process. As a result, the center position of the single crystal can be ascertained in a very short period of time.

In the present invention, it is preferable that the even function is a quadratic equation and the approximated curve is calculated by means of least-squares method. With this method, it is possible to determine the approximate curve with a relatively simple operation and by so doing, the effect of melt adherence can be removed with certainty.

In the present invention, it is preferable that the least-squares method has non-linear weights, and the non-linear weight becomes smaller as the deviation between the pixel of the fusion ring and the approximate curve is positive and becomes larger. By this method, the edge pattern of the fusion ring, from which the effect from the adherence of melt has been removed, can easily be specified and the approximate curve can be accurately and easily calculated.

In the present invention, it is preferable that the step of detecting the edge line of the fusion ring includes setting the luminance arrived at by multiplying the maximum brightness in the captured image that includes the fusion ring with a predetermined coefficient as a reference value, and detecting pixels closest to the side of the melt out of pixels that have the same brightness as the reference value as the constituent pixels of the edge line. With this method, the shape and position of the fusion ring can be accurately specified and the position of the single crystal can be accurately specified from the image of the fusion ring.

In the present invention, it is preferable that the melting process includes steps of generating a melt by dissolving initial raw material which has been charged in the crucible, and additionally depositing new raw material into the melt. When the raw material is additionally deposited into the melt, the melt splatters and a large quantity of the melt tends to adhere to the heat shielding body. For this reason, the luminance distribution of the fusion ring changes by a large amount and accurately measuring the center position of the single crystal from the image of the fusion ring becomes extremely difficult. However, with the present invention, the effect of melt adherence can be removed from the image of the fusion ring and the center position of the single crystal can be accurately determined.

In the present invention, it is preferable that the step of calculating the center position of the single crystal includes steps of setting up first and second measuring lines which orthogonally intersect a reference value that passes through the center position of the single crystal and which are separated by first and second distances from the center position, detecting the two intersections of the first measuring line and the edge line of the fusion ring and calculating the first interval between the two intervals on the first measuring line, detecting the two intersections of the second measuring line and the edge line of the fusion ring and calculating the second interval between the two intervals on the second measuring line, and calculating the center position of the single crystal which is positioned on the reference value based on the first interval, the second interval, the first distance and the second distance. With this method, the center position of the single crystal can be calculated with little computation in instances where the fusion ring can only be partially observed during the pulling-up process. Consequently, the melt surface position can be measured with high precision. The edge pattern of the fusion ring, from which the effects of the adherence of melt on the heat shielding body has been removed, can be easily specified and the approximate curve can be accurately and easily ascertained.

With the present invention, even if the luminance distribution of the fusion ring has changed due to the adherence of melt on the heat shielding body, the effects of the change can be removed and the true fusion ring can be detected accurately. As a result, the center position of the single crystal can be determined accurately from the fusion ring and the melt surface position can be accurately measured and controlled from the center position of the single crystal.

BRIEF DESCRIPTION OF THE DRAWINGS

The above and other objects, features and advantages of this invention will become more apparent by reference to the following detailed description of the invention taken in conjunction with the accompanying drawings, in which.

DETAILED DESCRIPTION OF THE EMBODIMENTS

Preferred embodiments of the present invention will be explained hereinafter in detail with reference to the accompanying drawings.

Figure 1:
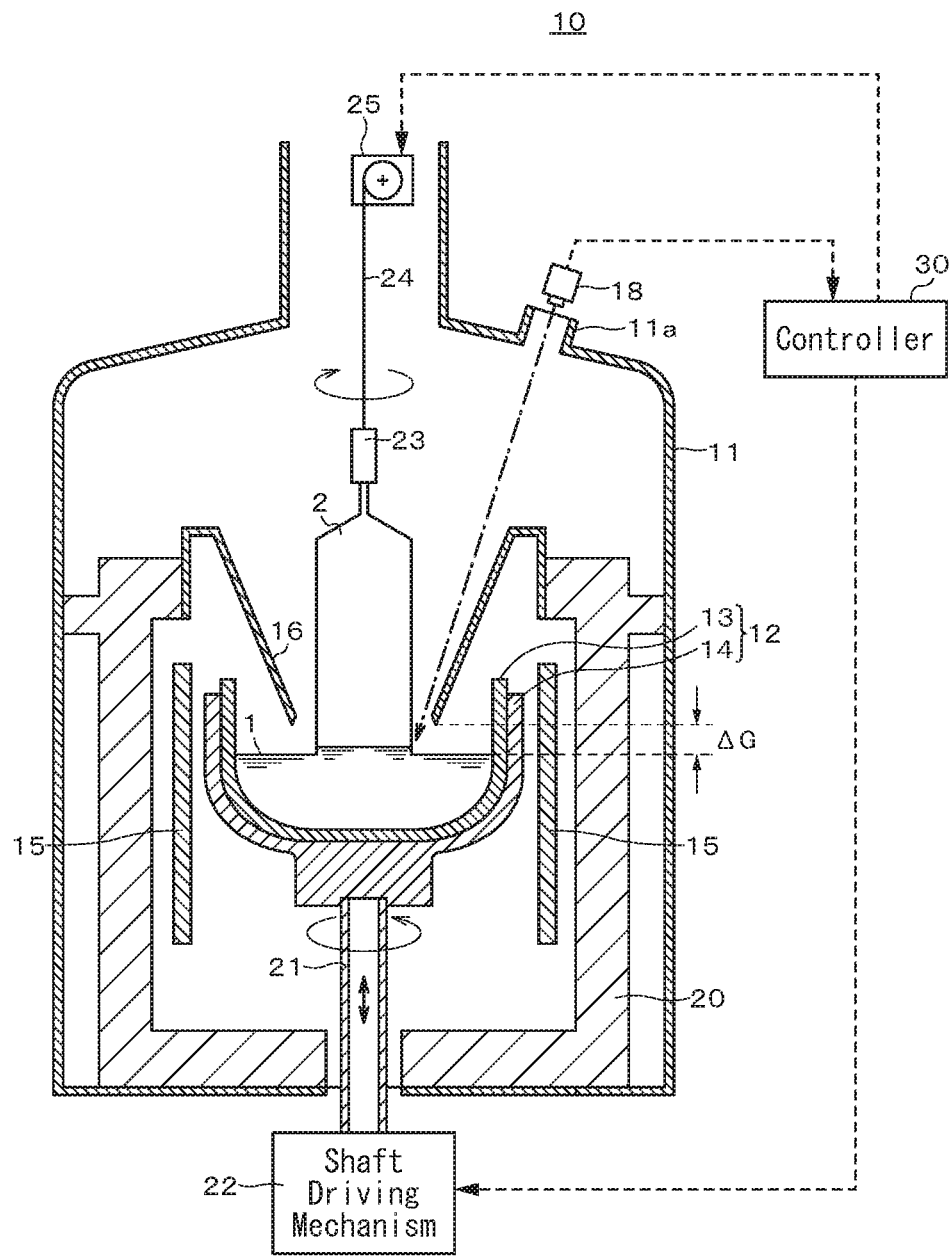
FIG. 1 is a lateral cross-sectional view illustrating a structure of the single crystal pulling-up apparatus in a preferred embodiment of the present invention.

FIG. 1 is a lateral cross-sectional view illustrating a structure of the single crystal pulling-up apparatus in a preferred embodiment of the present invention.

As shown in FIG. 1, the single crystal pulling-up apparatus 10 is equipped with a chamber 11, a crucible 12 which holds a melt 1 in chamber 11, heater 15 which is installed on the outboard side of the crucible 12, a heat shielding body 16 which prevent the heating up of a single crystal 2 due to radiant heat from the heater 15 and crucible 12, while controlling the fluctuation of the temperature of melt 1, a CCD camera 18 which captures the liquid surface of the melt 1, and a controller 30 which controls each component.

The crucible 12 comprises a quartz crucible 13 and a graphite susceptor 14 which supports the quartz crucible 13. The melt 1, which is a raw material for single crystals, is held in the quartz crucible 13. For example, the bore diameter of the quartz crucible 13 is 800 mm and an extremely large crucible can be used. A cylindrical heat-insulating material 20 is installed on the outer side of the heater 15. The crucible 12 is fixed on the top end of a shaft 21, which goes through the base center of the chamber 11 and is installed in a vertical direction, and the shaft 21 is raised, lowered and rotated by a shaft driving mechanism 22. The shaft driving mechanism 22 operates according to commands from the controller 30.

A seed chuck 23 which holds the seed crystal and a wire-winding mechanism 25 which winds the wire 24 are installed above the crucible 12. The wire-winding mechanism 25 also rotates the wire 24. When pulling up the single crystal, the seed crystal is dipped in the melt 1 and gradually pulled up, while the crucible 12 and the seed crystal are rotated in opposite directions. The wire-winding mechanism 25 operates according to commands from the controller 30.

The heat shielding body 16 is a cylindrical component placed above the crucible 12 and is in the shape of an inverted truncated cone, the diameter of which shrinks from top to bottom. The downward slope of the heat shielding body 16 may be gentle and, for example, can be 10-45°. The heat shielding body 16 is placed on the inside of the crucible 12, and when the crucible 12 is raised, the side walls of the crucible 12 are positioned on the outside of The hat shielding body 16 and do not interfere with it. Graphite can be used as material for the heat shielding body 16.

The heat shielding body 16 also functions as a gas-rectifying component that rectifies the flow of gas near the surface of the melt 1. By suitably adjusting the position (rise velocity) of the crucible 12 according to the growth of the single crystal 2, the distance from the liquid surface of the melt to the bottom end of the heat shielding body 16 (Gap ΔG) and the flow velocity of the gas that flows in the vicinity of the melt surface (purge-gas induction path) can be controlled. As a result, the evaporation amount of dopant from the melt can be controlled, and the stability of resistivity distribution in the direction of the pulling up of single crystals can be improved.

In growing single crystals by the CZ method, when solid raw material, which has been initially charged in the quartz crucible 13, melts, the amount of raw material melt that can be obtained in contrast to the capacity of the quartz crucible 13 is insufficient, due to a reduction in volume of the solid raw material after melting. For this reason, the solid raw material is additionally supplied after the initial charge into the quartz crucible 13, but because there is some melt in the crucible 12 already, splashing occurs from the depositing of solid raw material and some melt can adhere to the bottom end of the heat shielding body. Melt adhesion of this kind effects the luminance distribution of the fusion ring as described below.

On the upper section of the chamber 11, an observation window 11a is provided in order to observe the liquid surface and the CCD camera 18 is installed on the outside of the observation window 11a. The CCD camera 18 is an imaging device that captures the image of the fusion ring, and captures the single crystal 2 and the liquid surface of the melt 1, which can be seen through the inside of the heat shielding body 16 from the observation window 11a. It is preferable for the image taken by the CCD camera 18 to be in grayscale, but it can also be in color. The CCD camera 18 is connected to the controller 30, and the captured two-dimensional image is inputted into the controller 30 and used to control the surface position.

It is preferable for the CCD camera 18 to be a two-dimensional CCD camera, but it may also be a one-dimensional CCD camera. In this case, a two-dimensional image can be obtained by a method in which the one-dimensional camera is mechanically moved in a horizontal direction, or by a method in which the measuring angle of the one-dimensional CCD camera is changed and the image of the fusion ring is scanned. Alternatively, both the surface position and the single crystals diameter may be measured using the CCD camera 18.

The image obtained by the CCD camera 18 is distorted as it is taken from a diagonal position above the singe crystal pulling-up apparatus 10. This distortion can be corrected using a theoretical formula calculated from geometrical optics. Additionally, corrections can be made using a correction table prepared in advance with a reference plate marked with graduations. This correction table calculates each conversion coefficient that indicates the distance per pixel for the vertical and horizontal directions in the image.

The surface position of the melt 1 has two meanings. One is the surface position inside the crucible 12 (particularly in the quartz crucible 13) which changes with the reduction of the melt 1, that mainly accompanies the pulling up of the single crystal, as well as with the change in capacity caused by a change in the shape of the crucible 12. The other is the surface position (Gap ΔG) relative to fixed equipment, such as the heater 15 and the heat shielding body 16 which, in addition to the changes in the surface position inside the crucible 12 described above, changes according to shifts in position of the crucible 12 in a vertical direction. In addition, as used herein, "surface position" unless specifically stated otherwise, refers to the surface position relative to fixed equipment, particularly, the heat shielding body 16.

Figure 2:
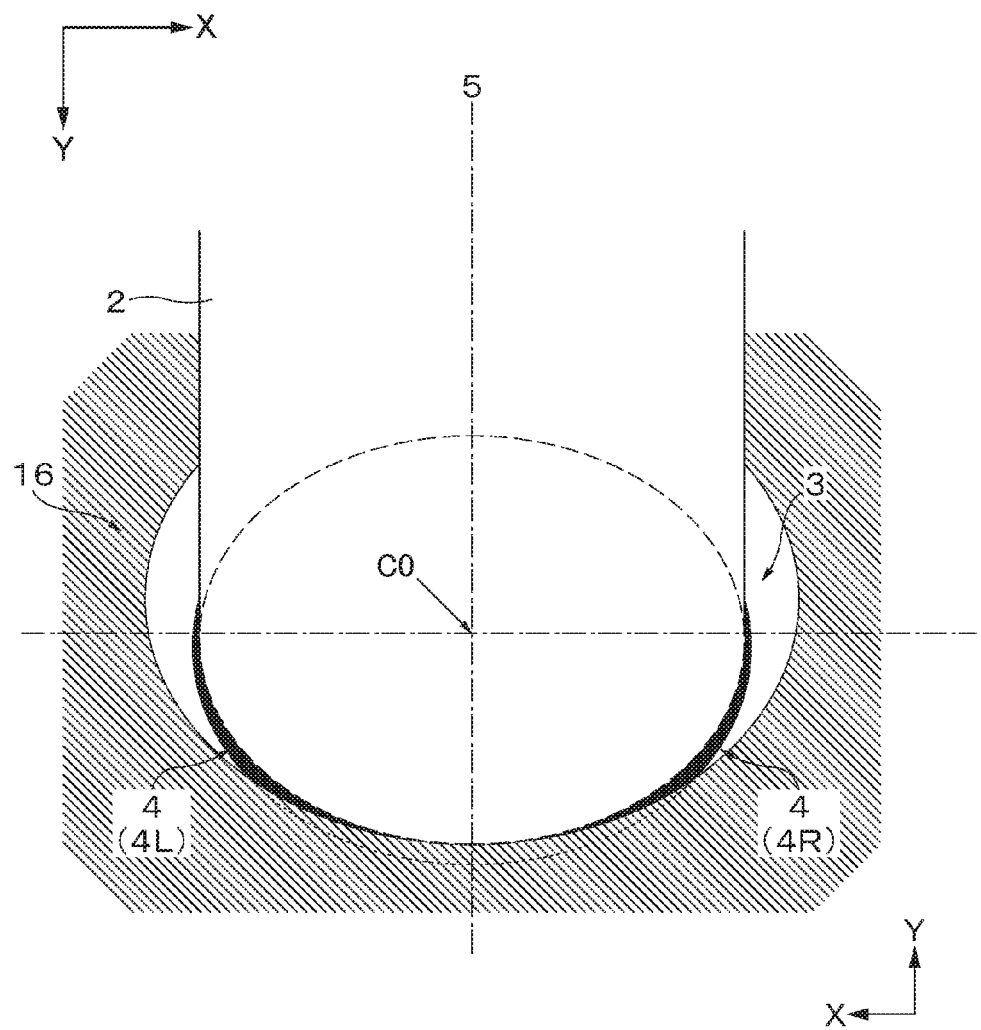
FIG. 2 is an oblique drawing that schematically shows an image of the vicinity of the solid-liquid interface captured by the CCD camera, and specifically is an image that shows the relationship between the center position of the single crystal and the melt surface position.

FIG. 2 is an oblique drawing that schematically shows an image of the vicinity of the solid-liquid interface captured by the CCD camera 18 and specifically is an image that shows the relationship between the center position of the single crystal and the melt surface position.

As FIG. 2 indicates, the controller 30 calculates the position of the center $C_0$ of the single crystal 2 from the fusion ring 4 that emerges near the solid-liquid interface between the single crystal 2 and the melt 3, and further calculates the liquid surface 3 of the melt from this center position. The position of the center $C_0$ of the single crystal 2 is at the intersection of the pulling-up axis 5 of the single crystal 2 and the liquid surface of the melt 3. If the CCD camera 18 and the heat shielding body 16 are installed accurately at predetermined angles and positions according to design, the position of the liquid surface 3 can be geometrically-optically calculated from the position of a fusion ring 4 appearing in the image.

The fusion ring 4 is a ring-shaped high-luminance region that emerges on the perimeter of the single crystal 2, but when viewed from a certain direction, the fusion ring 4, which is on the other side of the single crystal 2 cannot be visually recognized, and the frontmost portion of the fusion ring 4 is also hidden behind the heat shielding body 16 and likewise cannot be visually recognized. For this reason the only portions of the fusion ring 4 that are visually recognizable are the left-front portion 4L and right-front portion 4R relative to the direction of visual recognition. With the present invention, even in situations such as the above, where the fusion ring 4 can only be partially observed, the surface position of the melt 3 can be measured.

Figure 3:
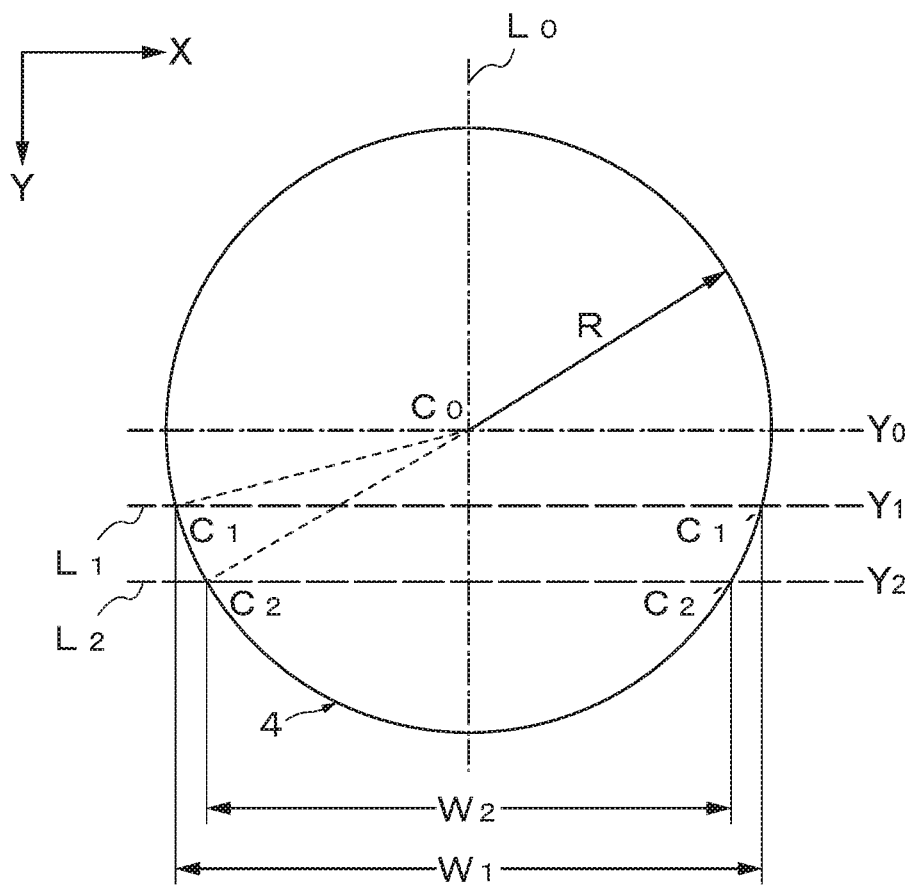
FIG. 3 is a schematic diagram that illustrates a method for measuring the surface position of melt using the single crystal pulling-up apparatus as indicated in FIG. 1.

FIG. 3 is a schematic diagram that illustrates a method for measuring the surface position of melt 1 using the single crystal pulling-up apparatus 10 as indicated in FIG. 1.

First, as shown in FIG. 3, two measuring lines $L_1$ and $L_2$ are set in the two-dimensional image captured by the CCD camera 18. The measuring lines $L_1$ and $L_2$ orthogonally intersect with the baseline $L_0$, which passes the center $C_0$ of the single crystal, and are straight lines along the X-coordinate direction of the two-dimensional image. The baseline $L_0$ is a straight line along the Y-coordinate direction in the two-dimensional image and coincides with the pulling-up axis 5.

The measuring line $L_1$ (first measuring line) is set on the outboard side relative to the center $C_0$ of the single crystal, that is to say, it is set at a lower position in the image. In addition, The measuring line $L_2$ (second measuring line) is set further toward the outboard side relative to the measuring line $L_1$, that is to say, it is set at a lower position than the measuring line $L_1$ in the image. The measuring line $L_1$ is set closer to the center $C_0$ of the single crystal, relative to the measuring line $L_2$. Additionally, it is preferable to set the measuring line $L_1$ at a somewhat distant position relative to the center $C_0$, since if the measuring line $L_1$ is set too close to the center $C_0$ of the single crystal, the single crystal blocks the view of the fusion ring 4 and the center $C_0$ becomes undetectable when the diameter of the single crystal shrinks. Additionally, since the position of the center $C_0$ of the single crystal which is supposed to be the standard position is unknown at the time of initially setting the measuring line $L_1$, the dipping position of the seed crystal in the necking process is used as the position of the center $C_0$ of the single crystal.

Next, two intersections $C_1$ and $C_1'$ of the measuring line $L_1$, and the fusion ring 4 and two intersections $C_2$ and $C_2'$ of the measuring line $L_2$, and the fusion ring 4 are detected. A reference value of the luminance of the fusion ring 4 is used to detect these four intersections. This reference value is obtained by multiplying the maximum luminance in the captured image with a predetermined coefficient. It is necessary for the reference value to be an appropriate value that can accurately specify the fusion ring 4 and as such, it may be changed according to the circumstances of the pulling-up process. For this reason, the coefficient is suitably selected, according to the circumstances of the pulling-up process, from a range of 0.6-0.95.

A single pixel with a maximum luminance may be a candidate for the maximum luminance in the captured image. Alternatively, in order to preclude the effect from noise, a consecutive series of pixels with a maximum luminance, or with a luminance close to the maximum, may be candidates. Because the maximum value of the detection luminance tends to appear successively over multiple pixels, when the light from the side walls of the crucible protruding above the surface position is reflected onto a meniscus, the effect of noise can be precluded by making such a luminance distribution a candidate for maximum luminance.

Formulas (1) and (2) can be obtained by labeling the interval between the intersections $C_1$ and $C_1'$ as $W_1$, the interval between the intersections $C_2$ and $C_2'$ as $W_2$, the Y-coordinates of the center $C_0$ of the single crystal as $Y_0$, the Y-coordinates of the measuring line $L_1$ as Y1, the Y-coordinates of the measuring line $L_2$ as $Y_2$, and the radius of the fusion ring as R.

$$R^2 = (W_1/2)^2 + (Y_0 - Y_1)^2 \tag{1}$$

$$R^2 = (W_2/2)^2 + (Y_0 - Y_2)^2 \tag{2}$$

From the relationship between the formulas (1) and (2), the positions of the Y-coordinates $Y_0$ of the center $C_0$ of the single crystal in the Y direction in the two-dimensional image are expressed with formula (3).

$$Y_0 = \{Y_1 + Y_2 + (W_1^2 - W_2^2)/4(Y_1 - Y_2)\}/2 \tag{3}$$

In addition, the surface position of the melt 1 is determined from the position $Y_0$ of the Y-coordinates of the center $C_0$ of the single crystal. The surface position of the melt 1 can be determined by converting the position $Y_0$ to Gap $\Delta G$, using a linear-regression line (calibration line) indicating the relationship between the distance (Gap $\Delta G$) from the liquid surface of the melt 1 to the lower end of the heat shielding body 16, and the Y-coordinates in the image.

With the present embodiment, it is preferable to set at least 2 pairs (for example, 10 pairs) of combinations of the measuring lines $L_1$ and $L_2$ as indicated above and make the average value of the center position of the single crystal that corresponds to each combination the final center position of the single crystal. When the cross section of the single crystal 2 is a perfect circle, the measurement deviation is very low. However, depending on the circumstances of the pulling-up process, the single crystal 2 can change shape from being a perfect circle and the measurement deviation can become greater. If the crystal habit line of the single crystal appears on the measuring line the measurement deviation becomes greater for that part of the measurement. However, by utilizing an average value from a plurality of measure values, the effect of the measurement deviation can be made smaller.

In the method of measuring the center position of the single crystal 2 as described above, when calculating the intersections $C_1$, $C_1'$, $C_2$ and $C_2'$ of the measuring lines $L_1$, $L_2$, and the fusion ring 4, the edge of the fusion ring 4 is detected using the reference value of the luminance, and the intersections of this edge and the measuring lines $L_1$ and $L_2$ are set as the intersections of the fusion ring 4. This is because the fusion ring 4 is a belt-shaped high-luminance region with a uniform width and it is necessary for the fusion ring 4 to be a line pattern in order to determine the intersections accurately.

However, when the melt adheres to the bottom end of the heat shielding body 16, a high-luminance area also appears on the outside (on the melt side) of the true fusion ring and the luminance distribution of the fusion ring changes overall. If the center position of the single crystal is determined using the edge pattern of the fusion ring that has received the effects of melt adhesion in this manner, its measurement deviation becomes greater. Accordingly, in the present embodiment, the effect of melt adhesion is removed by the method indicated below.

Figure 4:
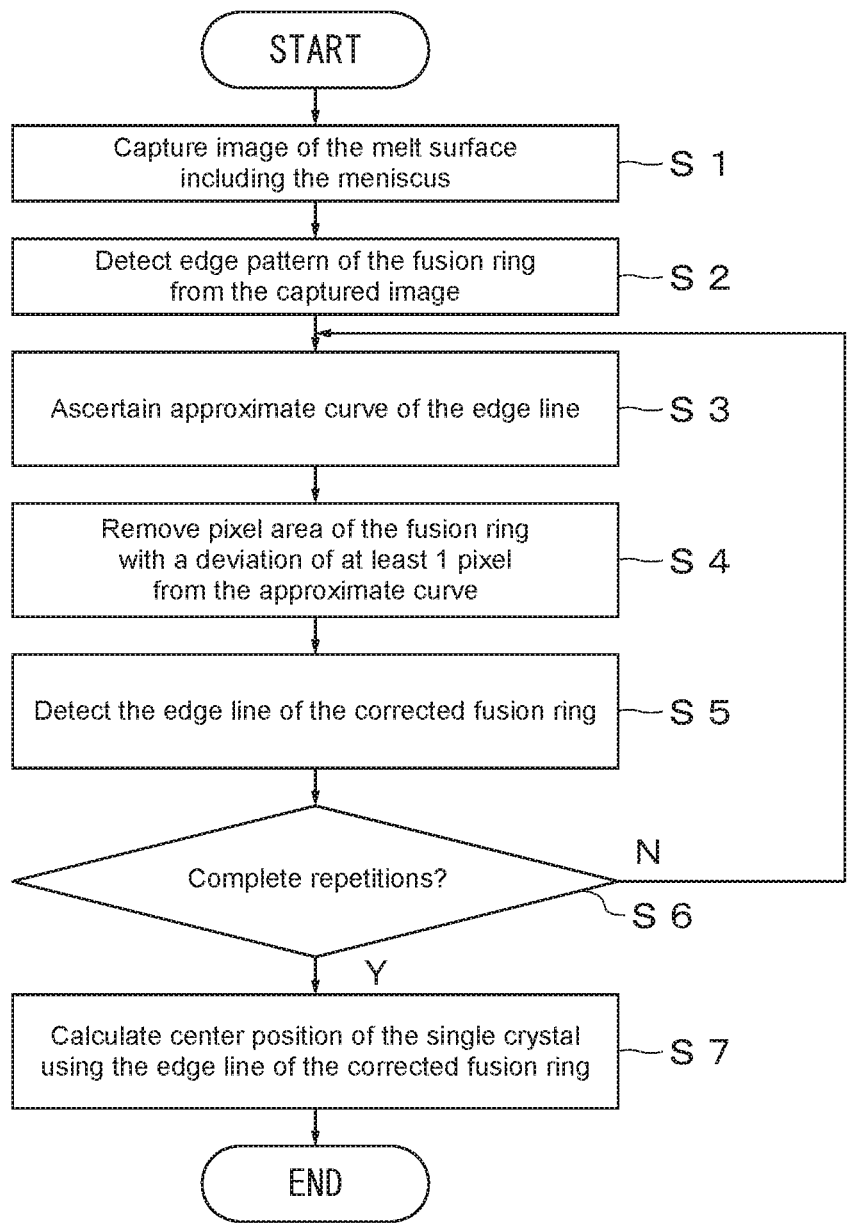
FIG. 4 is a flowchart indicating the method for detecting the fusion ring.

FIG. 4 is a flowchart indicating the method for detecting the fusion ring.

As indicated in FIG. 4, in detecting the fusion ring, first, an image of the melt surface including the meniscus is captured by the camera (Step S1). The meniscus is the liquid surface that is inclined from the surface tension in the periphery of the single crystal, and the fusion ring emerges from the light that is mainly reflected from the surface of the inner wall of the crucible and on the bottom surface of the heat shielding body onto the meniscus.

Next, an edge pattern of the fusion ring is detected from the captured image (Step S2). The edge pattern is a cluster of pixels with a luminance that matches the reference value. As indicated in FIG. 2, the fusion ring 4 in the captured image is a belt-shaped high-luminance region stretching in the direction of the Y-coordinates parallel to the pulling-up axis 5, and the edge pattern of the fusion ring is a line pattern (edge line) which connects the pixels on the furthermost melt side of the high-luminance region in a Y direction.

Next, the edge pattern of the fusion ring is approximated to an even function (for example, to a quadratic function) and an approximate curve of the edge line is ascertained (Step S3). The detection error of the edge line of the fusion ring occurs greatly weighted toward the melt side from receiving the effect of the portion of the fusion ring that appears to have high luminance due to the effect of the melt that has adhered to the heat shielding body 16. In order to efficiently remove the edge pattern that has deviated toward to melt side in this way, it is preferable to use the least-squares method that has been attributed non-linear weight that becomes smaller as the deviation becomes larger.

Next, the edge line of the fusion ring and the approximate curve is compared and the constituent pixels of the fusion ring, where the deviations for both are for example at least 1 pixel on the positive side (the melt side), are removed as noise from the image of the fusion ring (Step S4). By determining the edge line again from the image of the fusion ring that has been corrected in this way, the edge line of the fusion ring removed of noise deriving from the effect of melt adhesion can be obtained (Step S5). Additionally, by repeating a step that further corrects the image of the fusion ring a predetermined number of times (Step S6N, S3-S5), employing the edge line of the fusion ring removed of noise, an edge line for the fusion ring that has been thoroughly removed of the effects of melt adhesion can be ascertained.

Subsequently, as illustrated above in reference to FIG. 3, the center position of the single crystal is calculated using the edge line of the fusion ring that has been removed of noise (Step S7). The center position of the single crystal obtained in this way is highly accurate, and by calculating the melt surface position based on such center position of the single crystal, the surface position can accurately be measured and controlled.

Figure 5:
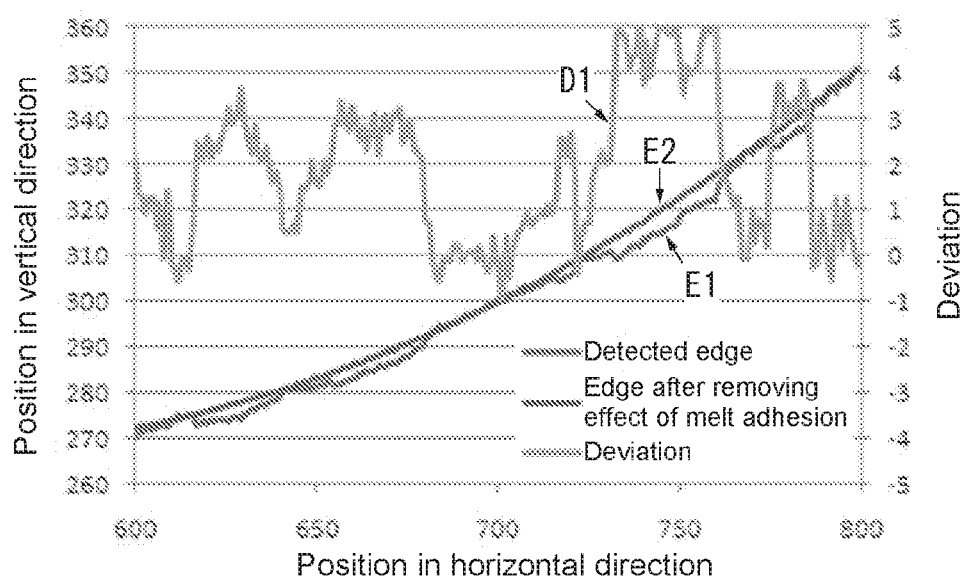
FIG. 5 is a graph showing the method for correcting the fusion ring.

FIG. 5 is a graph showing the method for correcting the fusion ring. In FIG. 5, the horizontal axis and left-vertical axis of the graph indicate the vertical and horizontal directions, respectively, of the captured image, and the right-vertical axis indicates the deviation between the edge line of the fusion ring and the approximate curve. In addition, the vertical and horizontal direction positions correspond to the Y and X positions, respectively, in FIG. 2.

As shown in FIG. 5, the edge line E1 of the fusion ring before the effects of melt adhesion has been eliminated is an extremely uneven curve. From the horizontal direction position of the edge line E1 veering greatly on the positive side in conjunction with the uneven change in the edge line, it can be easily seen that the deviation between such an edge line E1 and its approximate curve is from parts that became high luminance due to the effects of melt adhesion. Then, the edge line E2, after the effects of melt adhesion has been removed by the above method, becomes a very smooth curve, as illustrated. In this way, the edge line of the fusion ring can be determined more accurately, by eliminating the effects of melt adhesion.

Additionally, the diameter of the single crystal while being pulled up can be determined using the coordinates of the center $C_0$ of the single crystal, and the coordinates of any single point on the edge line E2 of the fusion ring, from which the effects of melt adhesion have been eliminated. The diameter of the single crystal is twice the distance between these 2 coordinates. The calculated diameter of the single crystal is used in controlling the diameter. For example, if the calculated diameter is larger than the target diameter, the diameter can be made smaller by speeding up the pulling-up process, or raising the heater temperature.

Figure 6:
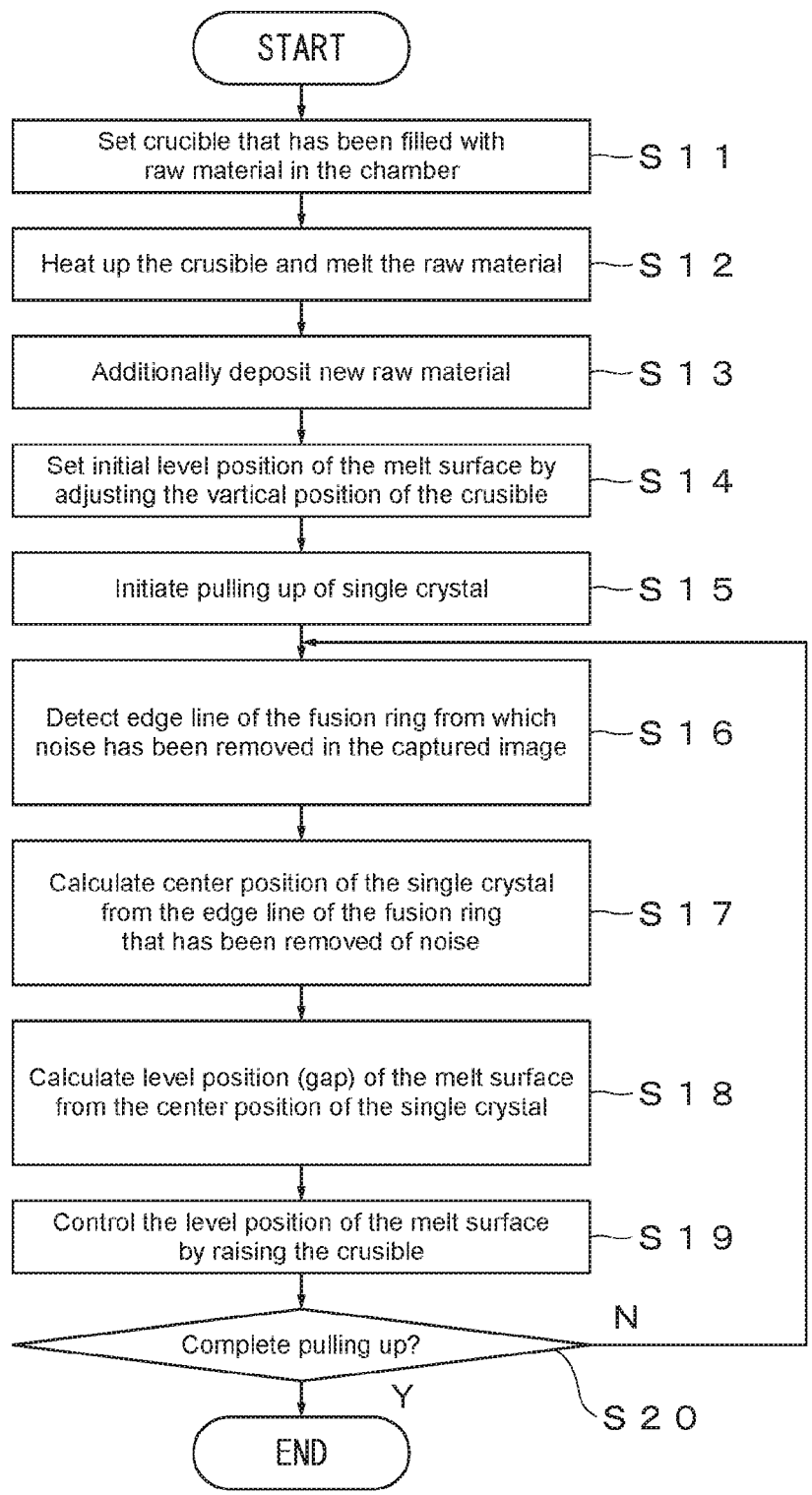
FIG. 6 is a flowchart showing the pulling-up method of the single crystal with melt surface position control by the CZ method.

FIG. 6 is a flowchart showing the pulling-up method of the single crystal by the CZ method, employing the single crystal pulling-up apparatus 10.

As shown in FIG. 6, in pulling up the single crystal, first, the crucible 12 is filled with a large quantity of raw material, and the crucible 12 is installed inside the chamber 11 (Step S11). Next, after creating an Ar gas atmosphere under reduced pressure in the chamber 11, the raw material in the crucible 12 is heated up and dissolved using the heater 15 (Step S12). During this time, the seed crystal installed on the tip of the wire 24 is at a sufficiently high position relative to the crucible 12 and is separated from the dissolving raw material. After the melting of the initial raw material inside the crucible 12 is complete, the amount of melt is increased by additionally depositing new raw material (Step S13).

Next, after the temperature has been adjusted until the melt 1 is stable, the vertical position of the crucible 12 is adjusted and the initial surface position of the melt 1 is set (Step 14). This is not specifically determined, but the initial surface position can be set automatically, or this may be done by an operator raising and lowering the crucible 12 while observing the liquid surface.

Next the pulling up of the single crystal is initiated (Step S15). In pulling up the single crystal using the CZ method, the single crystal is grown on the lower end of the seed crystal by slowly pulling up the seed crystal while the rotating shaft 21 and the wire 24 in opposite directions from each other.

In growing the sing crystal, first, in order to prevent transition, seed-narrowing (necking) by the Dash method is performed. Next, in order to obtain a single crystal with a desired diameter, a shoulder section is grown, and when the single crystal reaches the desired diameter, the diameter is made uniform and the body section is grown. After the body section has been grown to a predetermined length, a tail-narrowing (formation of the tail section) is performed in order to separate the single crystal from the melt while remaining in a non-transitory state.

In the necking process, in order to eliminate slip transition that arises in the seed crystal from the transition that is already included in the seed crystal and from the heat impact that occurs during the dipping process, the seed crystal is slowly raised above while being rotated in opposite directions and is thinly slenderized until its minimum diameter is 3-5 mm. When the length of the neck section reaches 10-20 mm and the slip transition has been completely eliminated, the diameter of the neck section is enlarged by adjusting the velocity of the pulling-up process of the seed crystal and the temperature of the melt 1, a conversion to growing the shoulder section takes place.

Once the shoulder section achieves a predetermined diameter, the body section is grown. In order to increase the wafer's yield, it is necessary to keep the diameter of the body section uniform, as such, the output of the heater 15, the pulling-up velocity, and the rise velocity of the crucible 12 is controlled during the growing of the single crystal, in order for it to grow while the body section maintains a uniform diameter. In particular, the crucible 12 is raised in coordination with a drop in the liquid surface due to a reduction in the melt 1 accompanying the growth of the single crystal.

During the pulling up the single crystal, an image of the liquid surface is captured using the CCD camera 18, in order to control the surface position, and the edge line of the fusion ring that has been corrected using the captured image is detected (Step S16). That is to say, the edge line of the fusion ring that has been removed of noise derived from melt adhesion onto the heat shielding body is determined.

Next, the center position of the single crystal is calculated (Step S17) using the edge line of the fusion ring that has been removed of noise, and the surface position (gap) of the melt is further calculated (Step S18) using the center position of the single crystal. The controller 30 raises the crucible 12 based on the calculated surface position of the melt and controls the crucible in order to maintain a uniform surface position (Step S19).

Once the body section reaches a predetermined length, the tail section is formed. In order to prevent occurrences of quality anomalies, such as slip transition and abnormal oxygen extraction, due to a disturbance in the heat balance between the melt 1 and the single crystal 2 that existed in the crystal growth interface and to the effects of a sudden heat impact on the crystal, a conical tail section is formed by gradually reducing the diameter and the single crystal is separated from the melt 1, thus completing the pulling-up process of the single crystal (Step S20). Subsequently, the single crystal ingot that has been separated from the melt 1 is cooled under predetermined conditions and the wafers sliced from the single crystal ingot are used as substrate material for various semiconductor devices.

As illustrated above, with the present embodiment, the melt surface position can be accurately controlled during the pulling up of single crystals by the CZ method and the manufacturing yield of single crystals can be improved.

Although the present invention has been described based on the preferred embodiments, the present invention is not limited to the above embodiments and various modifications may be made within the scope of the present invention. Accordingly, all such modifications are included in the present invention.

For example, in the above embodiment, the precision of the measurement of the fusion ring is improved by repeating the steps for correcting the edge line of the fusion ring several times over. However, it is not a required to repeat the steps for correcting the edge line in the present invention and the correction may be made only once.

Additionally, in the above embodiment, a quadratic function is used as an even function for obtaining the approximate curve for the edge line of the fusion ring, but an even function other than a quadratic function may be employed in the present invention. Additionally, in the above embodiment, the section where the deviation between the edge line of the fusion ring and its approximate curve is at least 1 pixel is removed from image of the fusion ring as noise, however, with the present invention, this deviation is not limited to at least 1 pixel, but may be at least 2, or 3 pixels.

What is claimed is:

1. A method of manufacturing a single crystal, the method comprising:
   a melting process which generates a melt by dissolving raw material in a crucible; and
   a pulling-up process which pulls up a single crystal from the melt by the Czochralski method, wherein
   the pulling-up process includes a step of calculating a center position of the single crystal from an image of a fusion ring which appears near a solid-liquid interface between the single crystal and the melt,
   the step of calculating the center position of the single crystal includes steps of:
      detecting an edge line of the fusion ring;
      determining an approximated curve of the edge line by approximating the edge line of the fusion ring by an even function;
      eliminating constituent pixels of the fusion ring from the image of the fusion ring as noise, the constituent pixels being positioned on the side of the melt relative to the approximated curve and the constituent pixels of the fusion ring and a deviation between the constituent pixels and the approximated curve being at least a predetermined number of pixels; and calculating the center position of the single crystal from the edge line of the fusion ring from which the noise has been eliminated.

2. The method as claimed in claim 1, wherein the pulling-up process further includes a step of determining the distance from a surface of the melt to a lower end of the heat shielding body that is disposed above the melt based on the center position of the single crystal.

3. The method as claimed in claim 1, wherein the pulling-up process further includes a step of determining a diameter of the single crystal based on the center position of the single crystal and the edge line of the fusion ring from which the effect of the noise has been eliminated.

4. The method as claimed in claim 1, wherein the step of eliminating the noise from the fusion ring is repeated again at a predetermined number of times.

5. The method as claimed in claim 1, wherein the even function is a quadratic equation and the approximated curve is calculated by means of least-squares method.

6. The method as claimed in claim 5, wherein the least-squares method has non-linear weights, and the non-linear weight becomes smaller as the deviation between the pixel of the fusion ring and the approximate curve is positive and becomes larger.

7. The method as claimed in claim 1, wherein the step of detecting the edge line of the fusion ring includes:
   setting the luminance arrived at by multiplying the maximum brightness in the captured image that includes the fusion ring with a predetermined coefficient as a reference value; and
   detecting pixels closest to the side of the melt out of pixels that have the same brightness as the reference value as the constituent pixels of the edge line.

8. The method as claimed in claim 1, wherein, the melting process includes steps of:
   generating a melt by dissolving initial raw material which has been charged in the crucible; and
   additionally depositing new raw material into the melt.

9. The method as claimed in claim 1, wherein the step of calculating the center position of the single crystal includes steps of:
   setting up first and second measuring lines which orthogonally intersect a reference value that passes through the center position of the single crystal and which are separated by first and second distances from the center position;
   detecting the two intersections of the first measuring line and the edge line of the fusion ring and calculating the first interval between the two intervals on the first measuring line;
   detecting the two intersections of the second measuring line and the edge line of the fusion ring and calculating the second interval between the two intervals on the second measuring line; and
   calculating the center position of the single crystal which is positioned on the reference value based on the first interval, the second interval, the first distance and the second distance.

\* \* \* \* \*